United States Patent
Lin et al.

(10) Patent No.: US 12,074,996 B2
(45) Date of Patent: Aug. 27, 2024

(54) CAMERA ASSEMBLY

(71) Applicant: Lanto Electronic Limited, Kunshan (CN)

(72) Inventors: Yu-Cheng Lin, Taipei (TW); Fu-Yuan Wu, Taipei (TW); Shang-Yu Hsu, Taipei (TW); Meng-Ting Lin, Taipei (TW)

(73) Assignee: LANTO ELECTRONIC LIMITED, Kunshan (CN)

( * ) Notice: Subject to any disclaimer, the term of this patent is extended or adjusted under 35 U.S.C. 154(b) by 0 days.

(21) Appl. No.: 17/992,124

(22) Filed: Nov. 22, 2022

(65) Prior Publication Data

US 2023/0164250 A1    May 25, 2023

(30) Foreign Application Priority Data

Nov. 22, 2021    (CN) .......................... 202111382823.1

(51) Int. Cl.
*H04M 1/02*        (2006.01)
*H04N 23/51*      (2023.01)
*H05K 1/18*        (2006.01)

(52) U.S. Cl.
CPC .......... *H04M 1/0264* (2013.01); *H04N 23/51* (2023.01); *H05K 1/189* (2013.01)

(58) Field of Classification Search
None
See application file for complete search history.

(56) References Cited

U.S. PATENT DOCUMENTS

| | | | |
|---|---|---|---|
| 10,663,689 | B2 | 5/2020 | Lee et al. |
| 2020/0073083 | A1 | 3/2020 | Lee |
| 2021/0318592 | A1 | 10/2021 | Kim et al. |
| 2022/0006935 | A1* | 1/2022 | Du ........................ G02B 7/022 |

FOREIGN PATENT DOCUMENTS

| | | |
|---|---|---|
| CN | 204442143 U | 7/2015 |
| CN | 105573014 A | 5/2016 |
| CN | 107277307 A | 10/2017 |
| CN | 207782987 U | 8/2018 |
| CN | 110058378 A | 7/2019 |
| CN | 110780509 A | 2/2020 |
| CN | 210038296 U | 2/2020 |
| CN | 111381342 A | 7/2020 |

(Continued)

*Primary Examiner* — James M Hannett
(74) *Attorney, Agent, or Firm* — Birch, Stewart, Kolasch & Birch, LLP

(57) ABSTRACT

A camera assembly comprises a casing, a light sensing component, and a flexible circuit board. The casing comprises a lens accommodating groove, an housing, and a base on which the housing is disposed. The lens accommodating groove is disposed between the housing and the base. An opening of the lens accommodating groove is disposed at the housing. The light sensing component comprises a light sensing member and a baseplate on which the light sensing member is disposed. The light sensing member is correspondingly disposed at the bottom of the lens accommodating groove. The light sensing component is disposed on the base. The flexible circuit board comprises a first end part, a second end part, and a body part disposed between the first end part and the second end part.

19 Claims, 12 Drawing Sheets

(56) References Cited

FOREIGN PATENT DOCUMENTS

| | | |
|---|---|---|
| CN | 112770060 A | 5/2021 |
| CN | 112804415 A | 5/2021 |
| CN | 112886788 A | 6/2021 |
| CN | 113242375 A | 8/2021 |
| CN | 113433760 A | 9/2021 |
| TW | I490630 B | 7/2015 |
| TW | I578093 B | 4/2017 |
| TW | I579629 B | 4/2017 |
| TW | I624706 B | 5/2018 |
| TW | 202111367 A | 3/2021 |
| TW | M620036 U | 11/2021 |
| WO | 2018/219324 A1 | 12/2018 |

\* cited by examiner

CAMERA ASSEMBLY

CROSS-REFERENCE TO RELATED APPLICATION

This application claims the priority benefit of Chinese Patent Application Serial Number 202111382823.1, filed on Nov. 22, 2021, the full disclosure of which is incorporated herein by reference.

BACKGROUND

Technical Field

The present disclosure relates to the technical field of camera assembly, particularly to a camera assembly comprising a flexible circuit board.

Related Art

Conventional cameras are usually provided with image stabilization mechanisms. When holding a camera by hand for shooting, there is often unstable hand shaking or vibration that affects the clarity of image. Optical image stabilization technology could compensate for the light for the image for excellent image quality. However, the flexible circuit board used in conventional camera modules is flat-typed, which considerably restricts and is unfavorable for the movement of the light sensing member in the camera module. Thus, the compensation for adjusting the light by the movement of the light sensing member is also affected.

SUMMARY

The embodiments of the present disclosure provide a camera assembly tended to solve the problem that the flat-type flexible circuit board of conventional camera device restricting the movement of the light sensing member used in camera modules by arranging flexible circuit board around the light sensing component.

The present disclosure provides a camera assembly, comprising a casing, a light sensing component, and a flexible circuit board. The casing comprises a lens accommodating groove, a housing, and a base on which the housing is disposed. The lens accommodating groove is disposed between the housing and the base. An opening of the lens accommodating groove is disposed at the housing. The light sensing component comprises a light sensing member and a baseplate on which the light sensing member is disposed. The light sensing member is correspondingly disposed at the bottom of the lens accommodating groove. The light sensing component is disposed on the base. The flexible circuit board comprises a first end part, a second end part, and a body part disposed between the first end part and the second end part. The first end part is connected to a side of the baseplate. The body part surrounds a periphery of the light sensing component. The second end part is disposed at one side of the light sensing component.

In one of the embodiments, the number of the flexible circuit boards is two. The first end parts of the two flexible circuit boards are connected to two opposite sides of the baseplate. When the body parts of the two flexible circuit boards extend vertically upward relative to a surface of the baseplate, the body parts of the two flexible circuit boards extend along the periphery of the light sensing component in opposite directions and are connected to the second end parts.

In one of the embodiments, the number of the flexible circuit boards is two. The first end parts of the two flexible circuit boards are connected to the same side of the baseplate. When the body parts of the two flexible circuit boards extend vertically upward relative to a surface of the baseplate, the body parts of the two flexible circuit boards extend along the periphery of the light sensing component in opposite directions and are connected to the second end parts.

In one of the embodiments, the first end part of the flexible circuit board is parallel to the surface of the baseplate. The body part and the second end part of the flexible circuit board are vertical to the surface of the baseplate.

In one of the embodiments, the camera assembly further comprises a carrying component and a magnetic component. The carrying component comprises a carrying body and a first coil disposed at the periphery of the carrying body. The carrying component is assembled in the lens accommodating groove. The magnetic component is disposed at the periphery of the first coil. The magnetic component is disposed on an inner wall of the lens accommodating groove.

In one of the embodiments, the light sensing component comprises a second coil. The second coil is disposed at the periphery of the light sensing member. The second coil is disposed below the magnetic component.

In one of the embodiments, the number of the second coils is multiple. The plurality of second coils comprise a first direction coil group and a second direction coil group. The first direction coil group is disposed on two opposite sides of the light sensing member. The second direction coil group is disposed on the other two opposite sides of the light sensing member.

In one of the embodiments, the first direction coil group comprises a plurality of first side coils and a plurality of second side coils. The plurality of first side coils are disposed on a side of the light sensing member. The plurality of second side coils are disposed on the other side of the light sensing member opposite to the side where the plurality of first side coils are disposed.

In one of the embodiments, the camera assembly further comprises a lens component assembled to the carrying body. The lens component is disposed in the lens accommodating groove.

In one of the embodiments, the camera assembly further comprises a carrying board carrying the bottom of the light sensing component. The carrying board is slidably disposed on the base.

In one of the embodiments, the base comprises a plurality of recesses and a plurality of balls slidably disposed in the plurality of recesses. The bottom surface of the carrying board is in contact with the plurality of balls.

In one of the embodiments, the bottom surface of the carrying board further comprises a plurality of bumps extended into the plurality of recesses. The thickness of each of the bumps is smaller than the depth of each of the recesses. The outer diameter of each of the bumps is smaller than the diameter of the opening of each of the recesses. The plurality of balls are respectively disposed between the corresponding recess and the bump.

In one of the embodiments, the camera assembly further comprises a plurality of first magnetic members and a plurality of second magnetic members. The plurality of first magnetic: members are disposed on the base. The plurality of second magnetic members are disposed at positions on the carrying board corresponding to the positions on the base where the plurality of first magnetic members are disposed.

The plurality of first magnetic members and the plurality of second magnetic members are mutually attracted.

In one of the embodiments, the casing comprises a holder disposed on the inside of the housing. The magnetic component is disposed at the holder surrounding the carrying component.

In one of the embodiments, the camera assembly further comprises a first spring member and a second spring member. An upper surface of the holder comprises an accommodating recess. Four sides of a lower surface of the holder comprise a securing column. The first spring member is disposed in the accommodating recess of the holder. An inner side of the first spring member abuts against the top of the carrying body. The first spring member is disposed between the holder and the housing. The second spring member is disposed at the securing column of the holder. An inner side of the second spring member supports the bottom of the carrying body. The second spring member is disposed at the periphery of the light sensing member.

In the embodiments of the present disclosure, by providing a camera assembly in which the flexible circuit board is designed to dispose around the light sensing component, the movement restrictions to the light sensing component by the flexible circuit board can be reduced. In this way, the light sensing member in the camera assembly would have a greater degree of freedom, which facilitates the movement of the light sensing member to adjust the light for compensation.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an" does not exclude other same elements existing in the process, the method, the article, or the device which includes the element.

Figure 1:
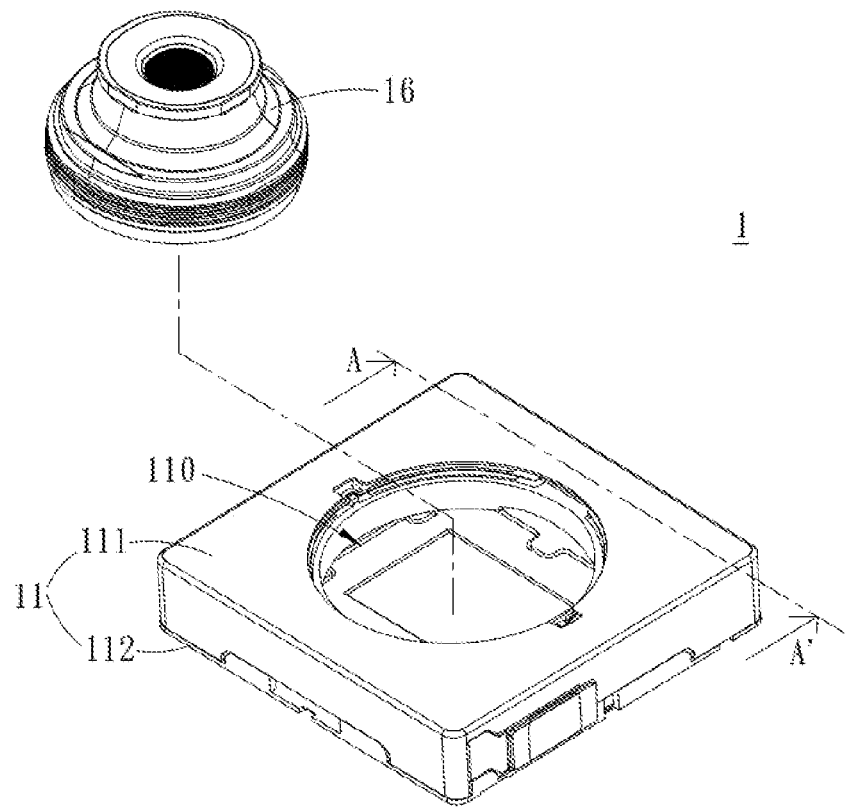
FIG. 1 is an exploded view of a lens component of a camera assembly of the present disclosure.
Figure 2:
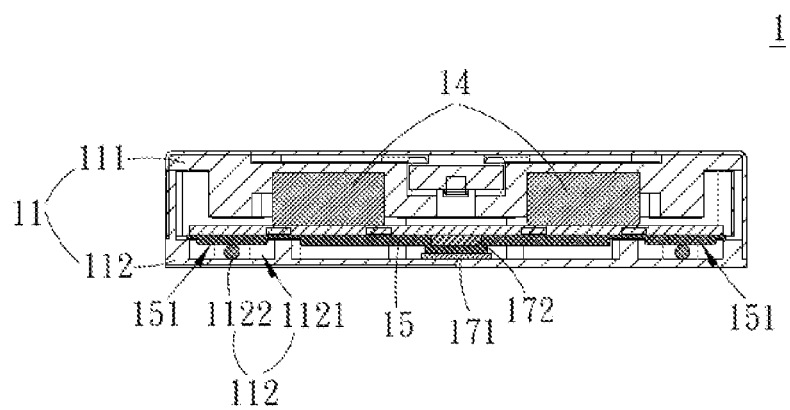
FIG. 2 is a cross-sectional view along line A-A' in FIG. 1.
Figure 3:
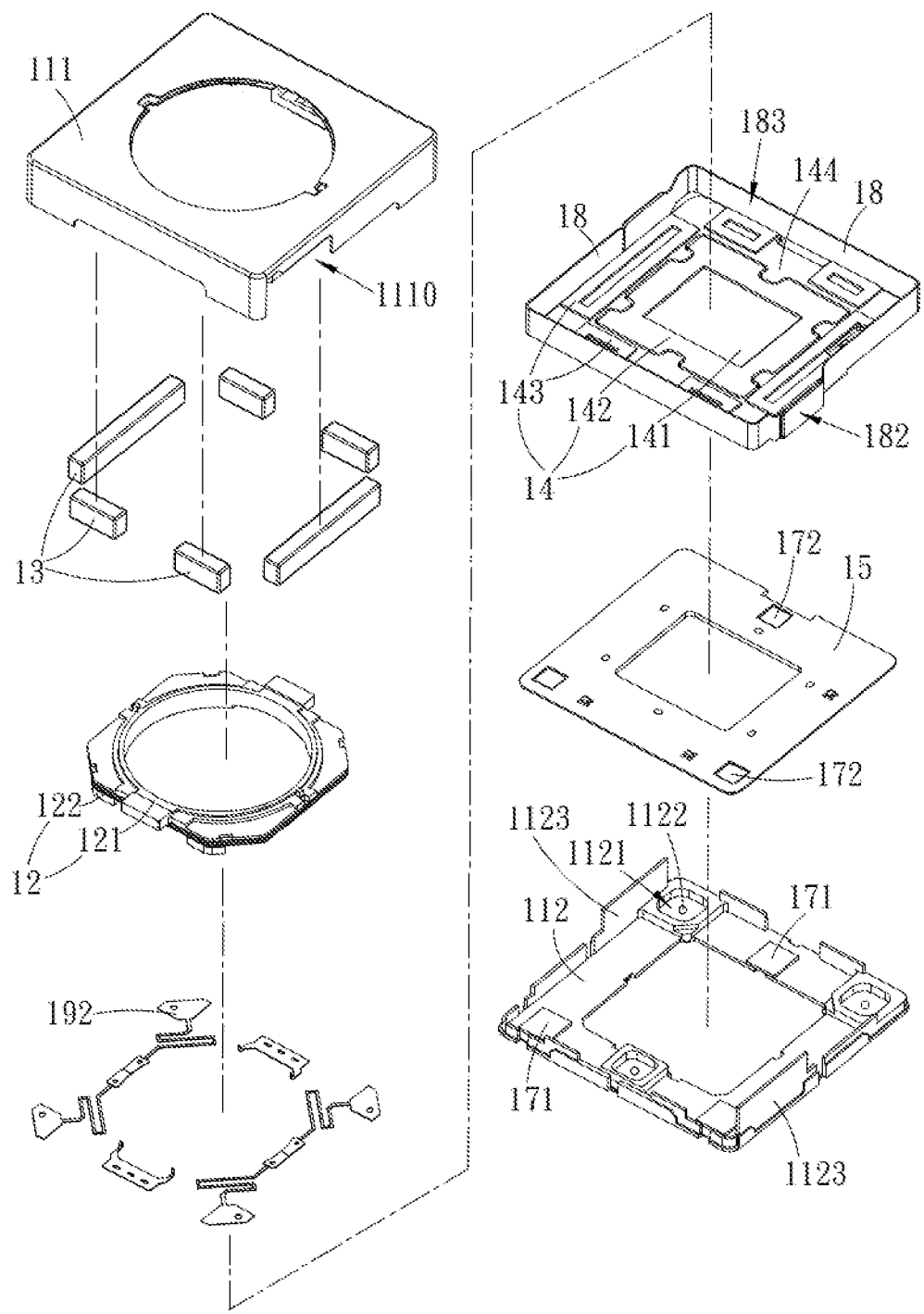
FIG. 3 is an exploded view of the camera assembly of the present disclosure.
Figure 4:
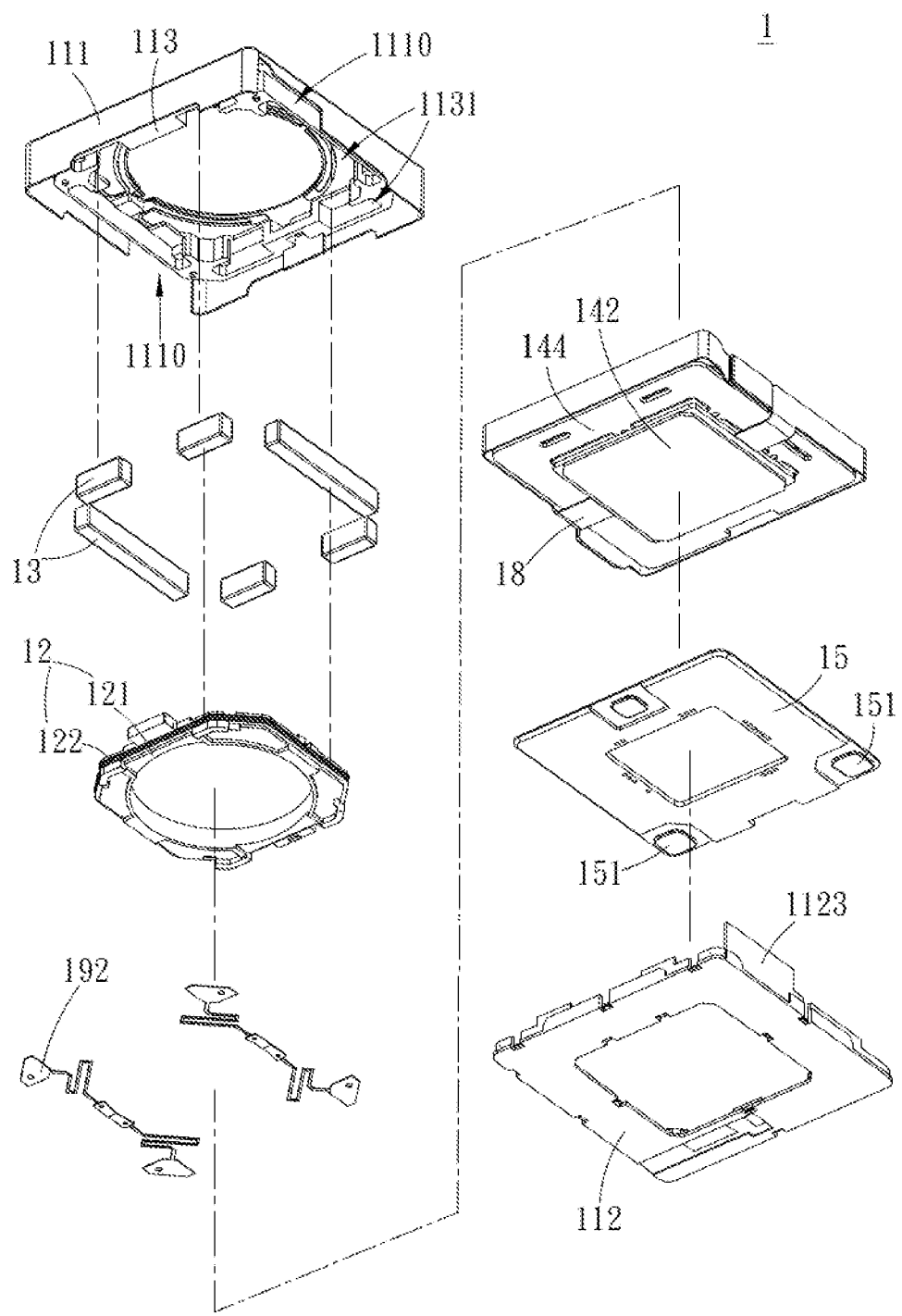
FIG. 4 is another exploded view of the camera assembly of the present disclosure.

FIG. 1 is an exploded view of a lens component of a camera assembly of the present disclosure. FIG. 2 is a cross-sectional view along line A-A' in FIG. 1. FIG. 3 and FIG. 4 are exploded views of the camera assembly of the present disclosure. As shown in the figures, the present disclosure provides a camera assembly 1, which comprises a casing 11, a carrying component 12, a magnetic component 13, a light sensing component 14, and a carrying board 15. The casing 11 comprises a lens accommodating groove 110, an housing 111, and a base 112 on which the housing 111 is disposed. The lens accommodating groove 110 is disposed between the housing 111 and the base 112. An opening of the lens accommodating groove 110 is disposed at the housing 111. The carrying component 12 comprises a carrying body 121 and a first coil 122 disposed at the periphery of the carrying body 121. The carrying component is assembled in the lens accommodating groove 110. The magnetic component 13 is disposed at the periphery of the first coil 122. The magnetic component 13 is disposed on an inner wall of the lens accommodating groove 110. The light sensing component 14 comprises a light sensing member 141, a baseplate 142, and a second coil 143. The light sensing member 141 is disposed on the baseplate 142. The light sensing member 141 is correspondingly disposed at the bottom of the lens accommodating groove. The second coil 143 is disposed at the periphery of the light sensing member 141 and is disposed below the magnetic component 13. The carrying board 15 carries the bottom of the light sensing component 14 and is slidably disposed on the base 112. The camera assembly 1 further comprises a lens component 16, which is assembled to the carrying body 121 and is disposed in the lens accommodating groove 110.

The base comprises a plurality of recesses 1121 and a plurality of balls 1122 slidably disposed in the plurality of recesses 1121. A bottom surface of the carrying board 15 is in contact with the plurality of balls 1122. Wherein, the bottom surface of the carrying board 15 further comprises a plurality of bumps 151 extended into the plurality of recesses 1121. The thickness of each of the bumps 151 is smaller than the depth of each of the recesses 1121. The outer diameter of each of the bumps 151 is smaller than the diameter of the opening of each of the recesses 1121. The plurality of balls 1122 are respectively disposed between the corresponding recess 1121 and the bump 151. In this way, when the bump 151 is disposed in the recess 1121, it can be displaced and rotated in the recess 1121. Meanwhile, the displacement range and rotation range of the bump 151 are also limited by the opening of the recess 1121.

Besides, the camera assembly 1 further comprises a plurality of first magnetic members 171 and a plurality of second magnetic members 172. The plurality of first magnetic members are disposed on the base 112. The plurality of second magnetic members 172 are disposed at positions on the carrying board 15 corresponding to the positions on the base 112 where the plurality of first magnetic members 171 are disposed. The plurality of first magnetic members 171 and the plurality of second magnetic members 172 are mutually attracted. In this way, when the plurality of bumps 151 of the carrying board 15 slide over the balls 1122 of the base 112, the bumps 151 of the carrying board 15 could move in close contact with the plurality of balls 1122 without having the carrying board 15 to detach from the base 112. In some embodiments, the first magnetic member 171 is a magnetic conductive sheet, and the second magnetic member 172 is a magnet. A magnet and a magnetic conductive sheet could be selected for the first magnetic member 171 and the second magnetic member 172 according to actual requirements.

Figure 5:
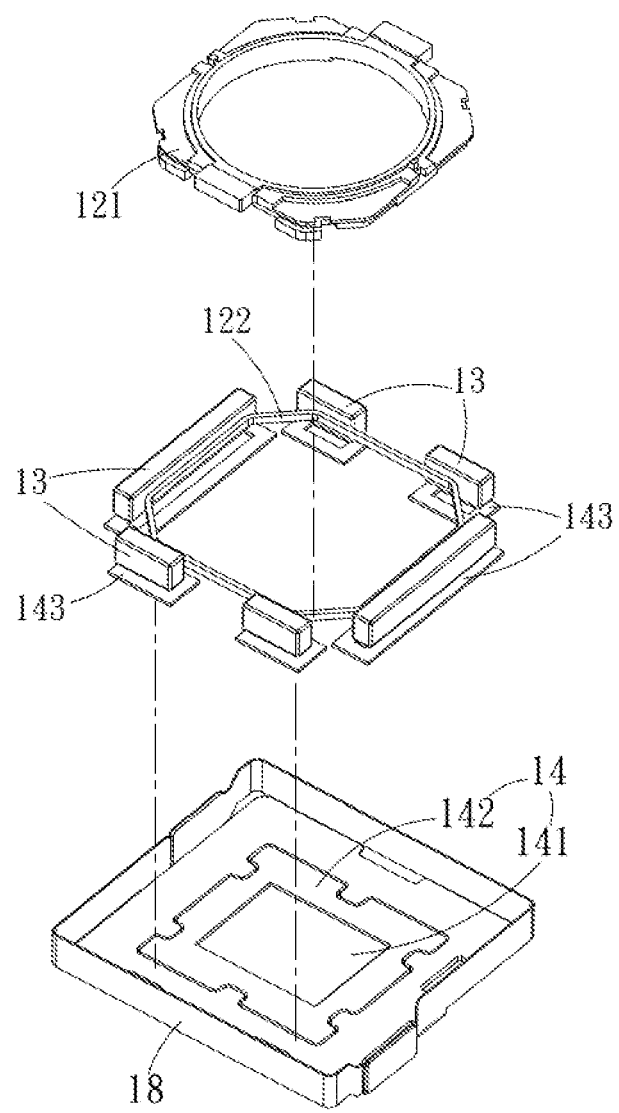
FIG. 5 is a perspective view of a driving mechanism of a camera assembly of the first embodiment of the present disclosure.
Figure 6:
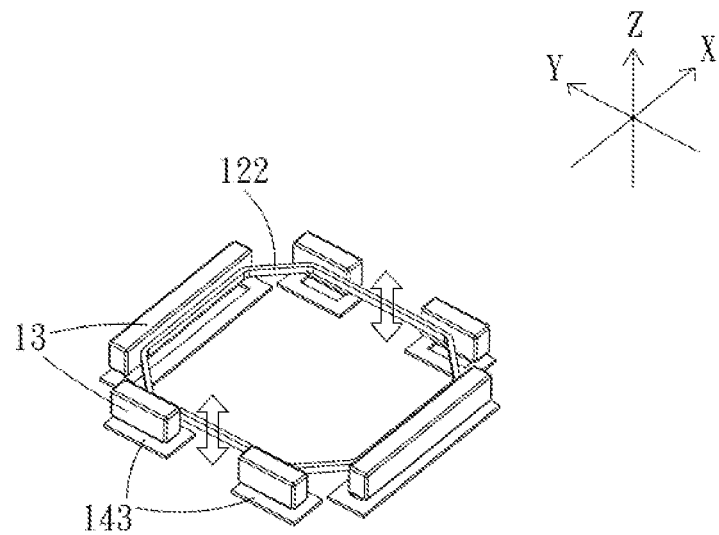
FIG. 6 is a schematic diagram of a driving direction of the driving mechanism of the present disclosure.
Figure 7:
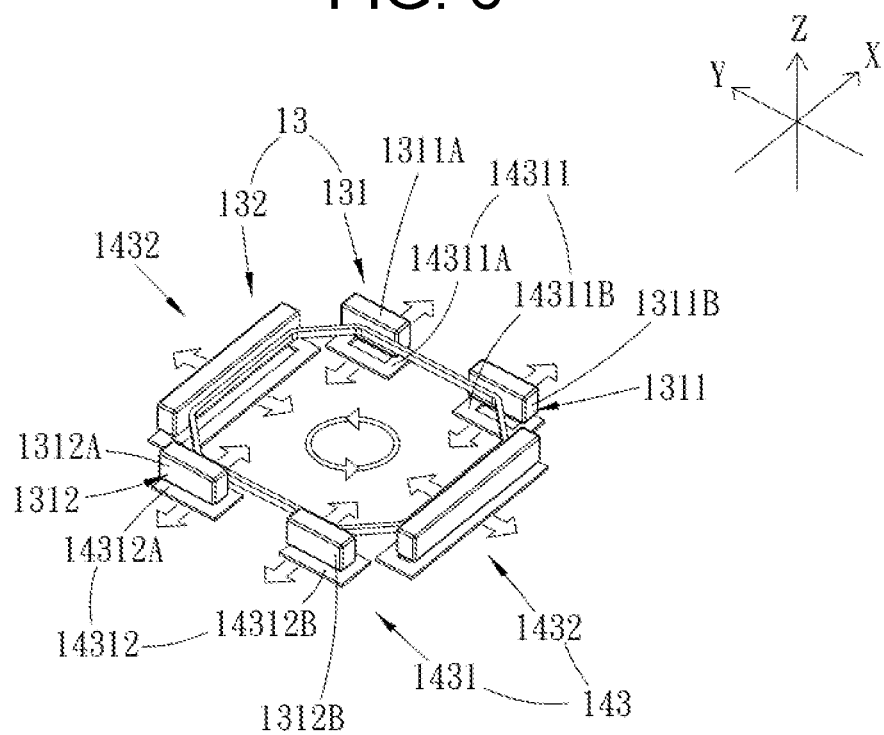
FIG. 7 is another schematic diagram of the driving direction of the driving mechanism of the present disclosure.

FIG. 5 is a perspective view of a driving mechanism of a camera assembly of the first embodiment of the present disclosure. FIG. 6 and FIG. 7 are schematic diagrams of driving directions of the driving mechanism of the present disclosure. As shown in the figures, in this embodiment, the first coil 122 is disposed around the periphery of the carrying body 121. When an electric current is introduced into the first coil 122, the first coil 122 would generate a magnetic force against the magnetic component 13 to drive the carrying body 121 to displace.

Furthermore, in this embodiment, the number of the second coils 143 is multiple. The plurality of second coils 143 are disposed at the periphery of the light sensing member 141. When introducing an electric current into the plurality of second coils 143, the plurality of second coils 143 would generate a magnetic force against the magnetic component 13 to drive the light sensing component 14 to horizontally displace or rotate. Besides, the carrying board 15 carries the bottom of the light sensing component 14. The bottom surface of the carrying board 15 is in contact with the plurality of balls 1122. Since the bottom surface of the carrying board 15 and a surface of the base 112 are not affected by friction, the carrying board 15 would not affect the horizontal displacement or rotation of the light sensing component 14.

Referring to FIG. 7 again, in this embodiment, the light sensing component 14 further comprises a coil plate member 144. The plurality of second coils 143 could be firstly disposed on or embedded in the coil plate member 144, which is annular, then the coil plate member 144 could dispose the plurality of second coils 143 at the periphery of the light sensing member 141 and could secure the plurality of second coils 143 at the outer side of the light sensing member 141. In this way, the plurality of second coils 143 could be disposed at the outer side of the light sensing member 141, which facilitates the assembly process of the camera assembly 1.

Moreover, the plurality of second coils 143 comprise a first direction coil group 1431 and a second direction coil group 1432. The first direction coil group 1431 is disposed on two opposite sides of the light sensing member 141. The second direction coil group 1432 is disposed on the other two opposite sides of the light sensing member 141. The magnetic component 13 comprises a first direction magnet group 131 and a second direction magnet group 132. The first direction magnet group 131 is disposed above the first direction coil group 1431, and the second direction magnet group 132 is disposed above the second direction coil group 1432. Wherein, the first direction coil group 1431 further comprises a plurality of first side coils 14311 and a plurality of second side coils 14312. The plurality of first side coils 14311 are disposed at a side of the light sensing member 141, and the plurality of second side coils 14312 are disposed at another side of the light sensing member 141 opposite to the side where the plurality of first side coils 14311 are disposed. Besides, the first direction magnet group 131 comprises a plurality of first side magnets 1311 and a plurality of second side magnets 1312. The plurality of first side magnets 1311 are respectively disposed above the plurality of first side coils 14311, and the plurality of second side magnets 1312 are respectively disposed above the plurality of second side coils 14312.

Referring to FIG. 6 again, directions of the X. Y, and Z axes are marked fir the description of the driving direction of the driving mechanism. When an electric current is introduced into the first coil 122 to generate a corresponding magnetic field, the magnetic field generated by the first coil 122 would generate an attractive or a repulsive force to the permanent magnetic field of the magnetic component 13. This implies that the first coil 122 could control the strength of the attractive and repulsive forces by introducing electric currents in various intensities. The carrying body 121 is driven by the first coil 122 to move back and forth in a vertical direction (i.e., the displacement in Z-axis direction), and the lens component 16 is assembled to the carrying body 121 so that the carrying body 121 can move closer to or away fom the light sensing component 14, thereby adjusting the distance between the lens component 16 and the light sensing member 141 for executing the focusing for the image.

Referring to FIG. 7 again, in this embodiment, directions of the X, Y, and Z axes are marked for the description of the driving direction of the driving mechanism. When an electric current is introduced into the second coil 143 to generate a corresponding magnetic field, the magnetic field generated by the second coil 143 would generate an attractive or a repulsive force to the permanent magnetic field of the magnetic component 13. This implies that the second coil 143 could control the strength of the attractive and repulsive forces by introducing electric currents in various intensities. The light sensing component 14 is driven by the second coil 143 to be displaced or rotated horizontally. Wherein, the first direction coil group 1431 of the second coil 143 could generate an attractive or repulsive force in the first direction (i.e., the X-axis direction) relative to the first direction magnet group 131 of the magnetic component 13, and the first direction coil group 1431 could drive the light sensing component 14 to move back and forth in the first direction (i.e., the X-axis direction). Besides, the second direction coil group 1432 of the second coil 143 could generate an attractive or repulsive force in the second direction (i.e., the Y-axis direction) relative to the second direction magnet group 132 of the magnetic component 13, and the second direction coil group 1432 could drive the light sensing component 14 to move back and forth in the second direction (i.e., the Y-axis direction). The displacement of the lens component 16 of this embodiment can be adjusted along the vertical direction, the first direction, and the second direction which are the three axial directions of X, Y, and Z.

Furthermore, the first direction coil group 1431 further comprises a plurality of first side coils 14311 and a plurality of second side coils 14312. The number of first side coils 14311 is two, and the number of first side magnets 1311 is two. The plurality of first side coils 14311 are arranged side by side along a side of the light sensing component 14, and the plurality of first side coils 14311 simultaneously correspond to the plurality of first side magnets 1311 of the first direction magnet group 131. The number of second side coils 14312 is two, and the number of second side magnets 1312 is two. The plurality of second side coils 14312 are arranged side by side along another side of the light sensing component 14, and the plurality of second side coils 14312 simultaneously correspond to the plurality of second side magnets 1312 of the first direction magnet group 131. In this embodiment, the plurality of first side coils 14311 and the plurality of second side coils 14312 could generate an attractive or a repulsive force in the first direction (i.e., the X-axis direction) relative to the magnetic component 13 by introducing electric current to the plurality of first side coils 14311 and the plurality of second side coils 14312 in the same direction.

In this embodiment, one of the two first side coils 14311 is referenced as 14311A while the other is 14311B, one of the two second side coils 14312 is referenced as 14312A while the other is 14312B, one of the two first side magnets 1311 is referenced as 1311A while the other is 1311B, and one of the two second side magnets 1312 is referenced as 1312A while the other is 1312B. Wherein, the first side coil 14311A is opposed to the second side coil 14312A, and the first side coil 14311B is opposed to the second side coil 14312B. An electric current is introduced into the first side coil 14311A and the second side coil 14312A in the same direction so that the first side coil 14311A could be positively displaced in the first direction X relative to the first side magnet 1311A, The second side coil 14312A could be positively displaced in the first direction X relative to the second side magnet 1312A, that is, displaced in a direction from the second side coil 14312A toward the first side coil 14311A.

Besides, the first side coil 14311B and the second side coil 14312B are also introduced with an electric current in the same direction, so the first side coil 14311B is negatively displaced in the first direction X relative to the first side magnet 1311B, and the second side coil 14312B is negatively displaced in the first direction X relative to the second side magnet 1312B, that is, displacement in a direction from the first side coil 14311B to the second side coil 14312B. In this way, the light sensing component 14 close to one side of the first side coil 14311A, and one side of the second side coil 14312A would be driven to be displaced in a direction from the second side coil 14312A toward the first side coil 14311A, and the light sensing component 14 close to one side of the first side coil 14311B and one side of the second side coil 14312B would be driven to be displaced in the direction from the first side coil 14311B toward the second side coil 14312B, thereby the light sensing component 14 can be driven to move in a clockwise direction. On the contrary, an electric current in reverse direction can also be introduced for counterclockwise displacement for the light sensing component 14.

Figure 8:
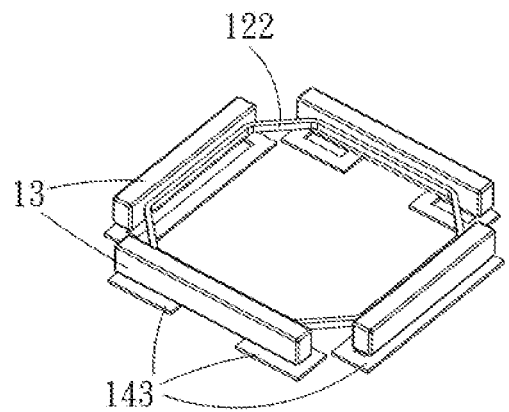
FIG. 8 is a perspective view of a driving mechanism of a camera assembly of the second embodiment of the present disclosure.

FIG. 8 is a perspective view of a driving mechanism of a camera assembly of the second embodiment of the present disclosure. As shown in the figure, the difference between the driving mechanism of this embodiment and the first embodiment lies in the magnetic component 13. In this embodiment, the magnetic components 13 are four permanent magnets and are disposed at the periphery of the first coil 122. Meanwhile, the magnetic component 13 is disposed above the second coil 143. The magnetic components 13 are not limited to four permanent magnets in this embodiment, it can be configured according to the number of coils. Back to FIG. 7, the four permanent magnets correspond to the plurality of first side coils 14311 and the plurality of second side coils 14312, respectively. The two permanent magnets correspond to the second direction coil group 1432.

Figure 9:
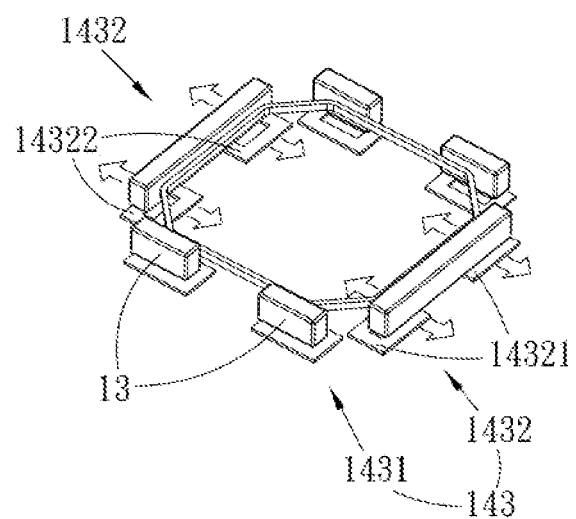
FIG. 9 is a perspective view of a driving mechanism of a camera assembly of the third embodiment of the present disclosure.

FIG. 9 is a perspective view of a driving mechanism of a camera assembly of the third embodiment of the present disclosure. As shown in the figure, the difference between the driving mechanism of this embodiment and the first embodiment lies in the second direction coil group 1432. The second direction coil group 1432 further comprises a plurality of first side coils 14321 and a plurality of second side coils 14322. The number of coils in the second direction coil group 1432 is the same as the number of coils in the first direction coil group 1431. In this way, the horizontal displacement or horizontal rotation of the light sensing component 14 could be precisely adjusted through the electric current directions of the first direction coil group 1431 and the second direction coil group 1432 for an accurate light compensation for the light sensing member 141.

In this embodiment, the number of magnetic components 13 or the number of coils of the first direction coil group 1431 and of the second direction coil group 1432 could be adjusted according to requirements to adjust the light sensing member 141 for light compensation.

Figure 10:
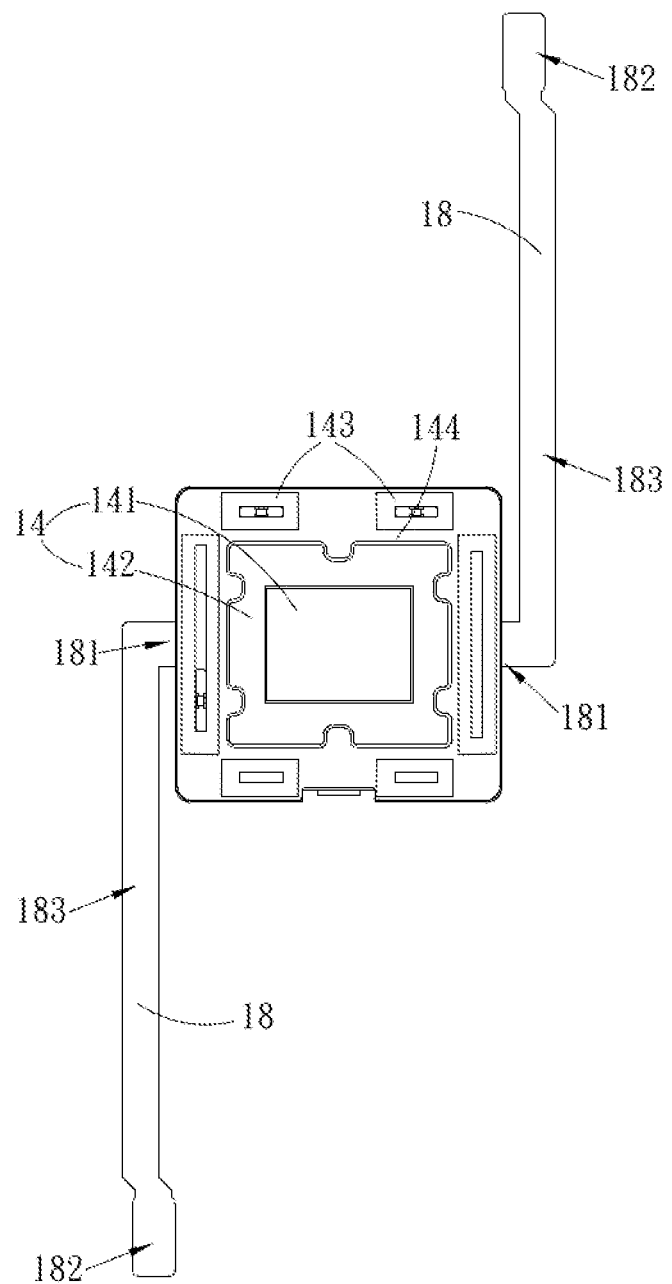
FIG. 10 is a structural diagram of a flexible circuit board of the camera assembly of the first embodiment of the present disclosure.
Figure 11:
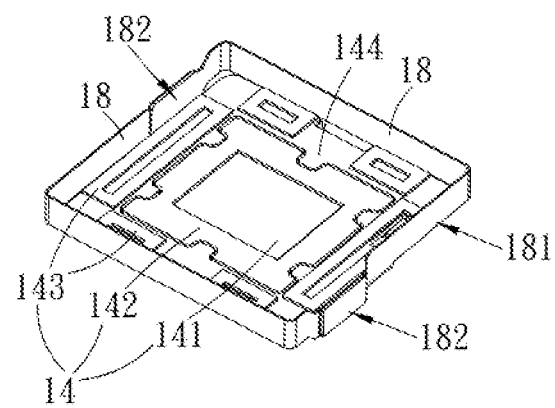
FIG. 11 is a perspective view of the flexible circuit board of the camera assembly of the first embodiment of the present disclosure.
Figure 12:
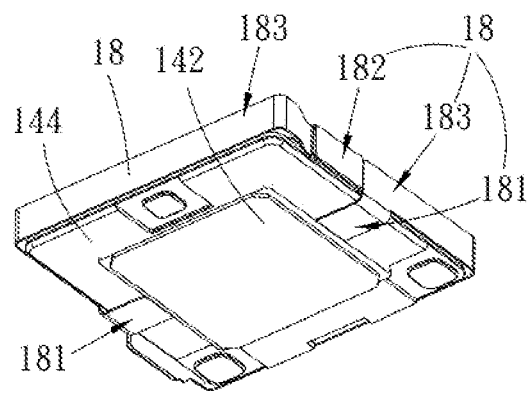
FIG. 12 is another perspective view of the flexible circuit board of the camera assembly of the first embodiment of the present disclosure.

FIG. 10 is a structural diagram of a flexible circuit board of the camera assembly of the first embodiment of the present disclosure. FIG. 11 and FIG. 12 are perspective views of the flexible circuit board of the camera assembly of the first embodiment of the present disclosure. As shown in the figures, in this embodiment, the camera assembly 1 further comprises a flexible circuit board 18 comprising a first end part 181, a second end part 182, and a body part 183 disposed between the first end part 181 and the second end part 182. The first end part 181 of the flexible circuit board 18 is connected to a side of the baseplate 142. The body part 183 of the flexible circuit board 18 surrounds the periphery of the light sensing component 14. The flexible circuit board 18 of this embodiment is disposed at the periphery of the light sensing component 14, which allows the moving range of the light sensing component 14 less restricted by the circuit of the flexible circuit board 18. When the light sensing component 14 is horizontally displaced or rotated, the flexible circuit board 18 could provide a proper space for displacement for the light sensing component 14 since the flexible circuit board 18 is disposed at the periphery of the light sensing component 14.

In this embodiment, the number of flexible circuit boards 18 is two. The first end parts 181 of the two flexible circuit boards 18 are connected to two opposite sides of the baseplate 142 and are extending below the carrying board 15 to two sides of the carrying board 15. The body parts 183 of the two flexible circuit boards 18 are winging upward from two sides of the carrying board 15, and when the body parts 183 of the two flexible circuit boards 18 extend vertically upward relative to a surface of the baseplate 142, the body parts 183 of the two flexible circuit boards 18 would extend along the periphery of the light sensing component 14 in opposite directions and would be connected to the second end parts 182 (as shown in FIG. 11 and FIG. 12).

Figure 13:
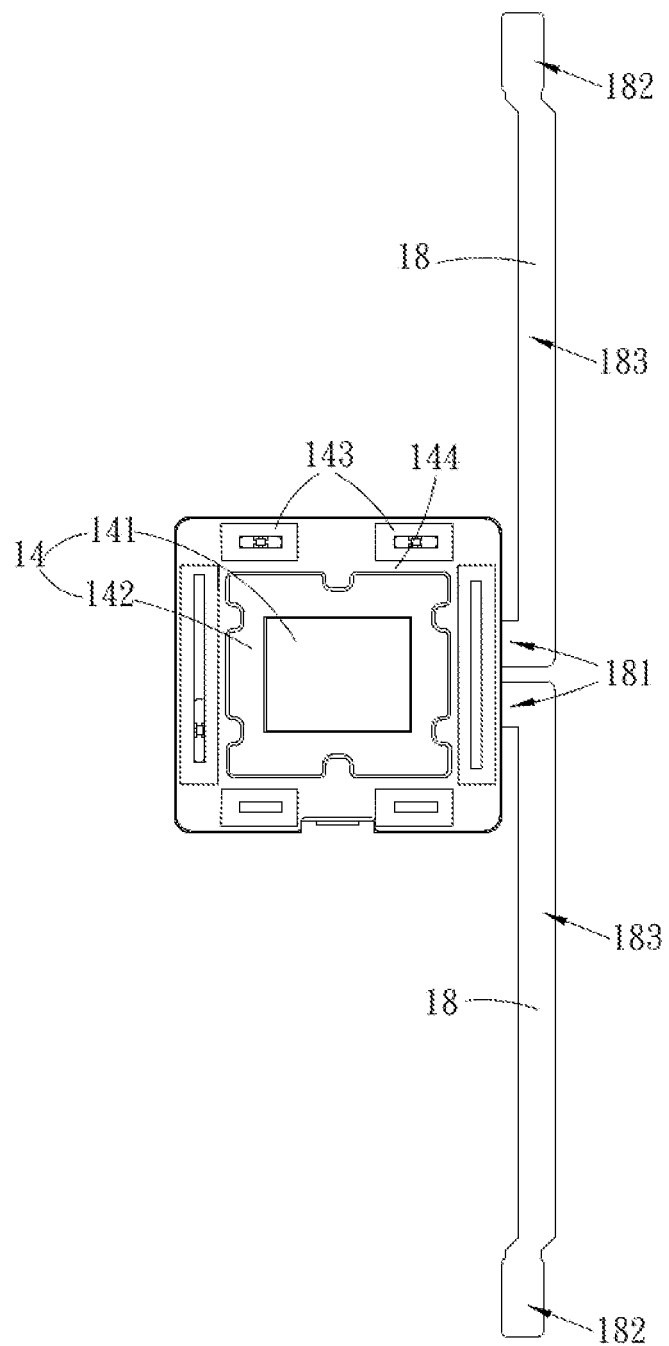
FIG. 13 is a structural diagram of a flexible circuit board of the camera assembly of the second embodiment of the present disclosure.
Figure 14:
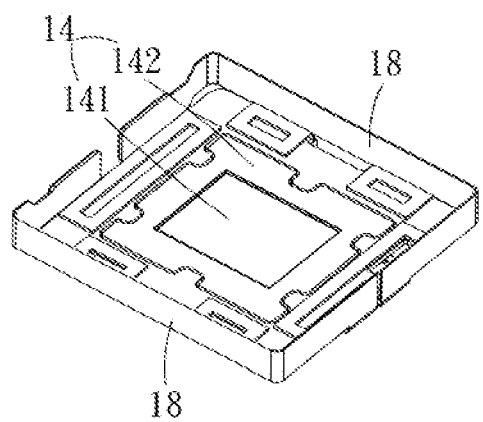
FIG. 14 is a perspective view of the flexible circuit board of the camera assembly of the second embodiment of the present disclosure.
Figure 15:
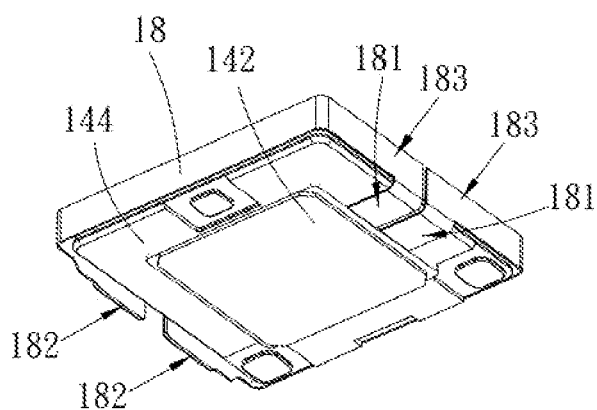
FIG. 15 is another perspective view of the flexible circuit board of the camera assembly of the second embodiment of the present disclosure.

FIG. 13 is a structural diagram of a flexible circuit board of the camera assembly of the second embodiment of the present disclosure. FIG. 14 and FIG. 15 are perspective views of the flexible circuit board of the camera assembly of the second embodiment of the present disclosure. As shown in the figures, the difference between this embodiment and the first embodiment of the flexible circuit board lies in the arrangement of the flexible circuit board 18. Similarly, the number of flexible circuit boards 18 is two. The first end parts 181 of the two flexible circuit boards 18 are connected to the same side of the baseplate 142 and are extending below the carrying board 15 to the same side of the carrying board 15. The body parts 183 of the two flexible circuit boards 18 are winding upward from the same side of the carrying board 15, and when the body parts 183 of the two flexible circuit boards 18 extend vertically upward relative to a surface of the baseplate 142, the body parts 183 of the two flexible circuit boards 18 are arranged in opposite directions and extend along the periphery of the light sensing component 14 and are connected to the second end parts 182.

Figure 16:
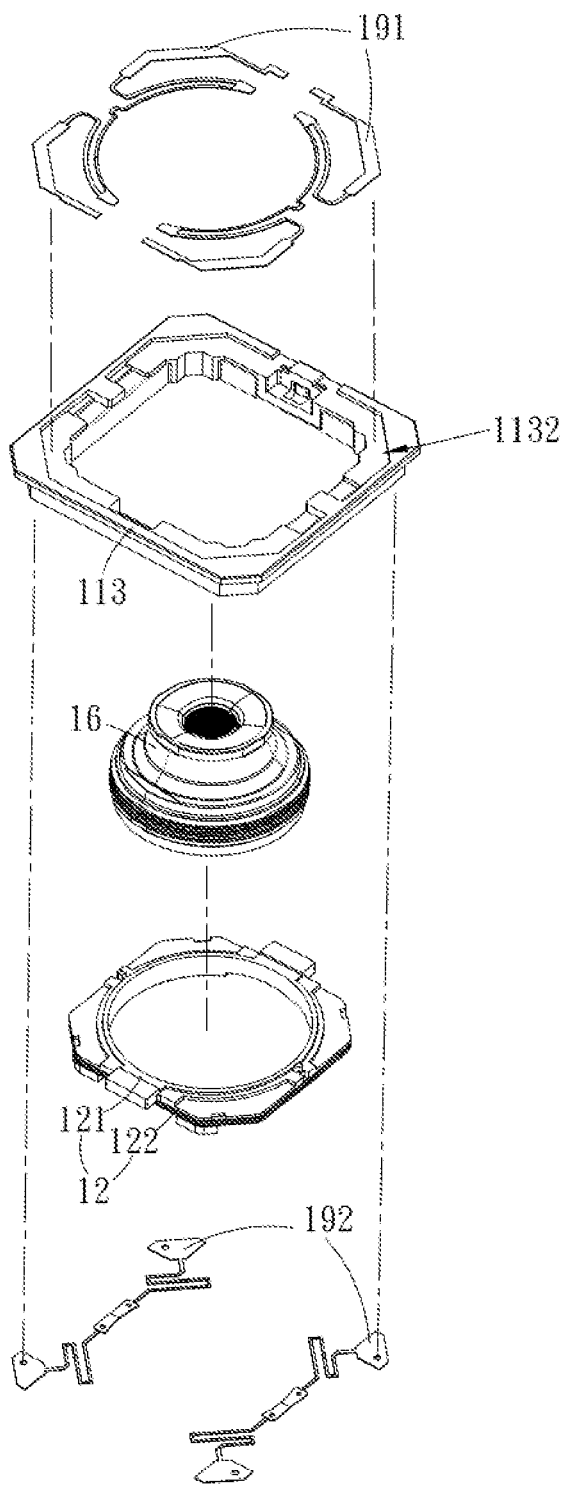
FIG. 16 is an exploded view of internal components of the camera assembly of the present disclosure.
Figure 17:
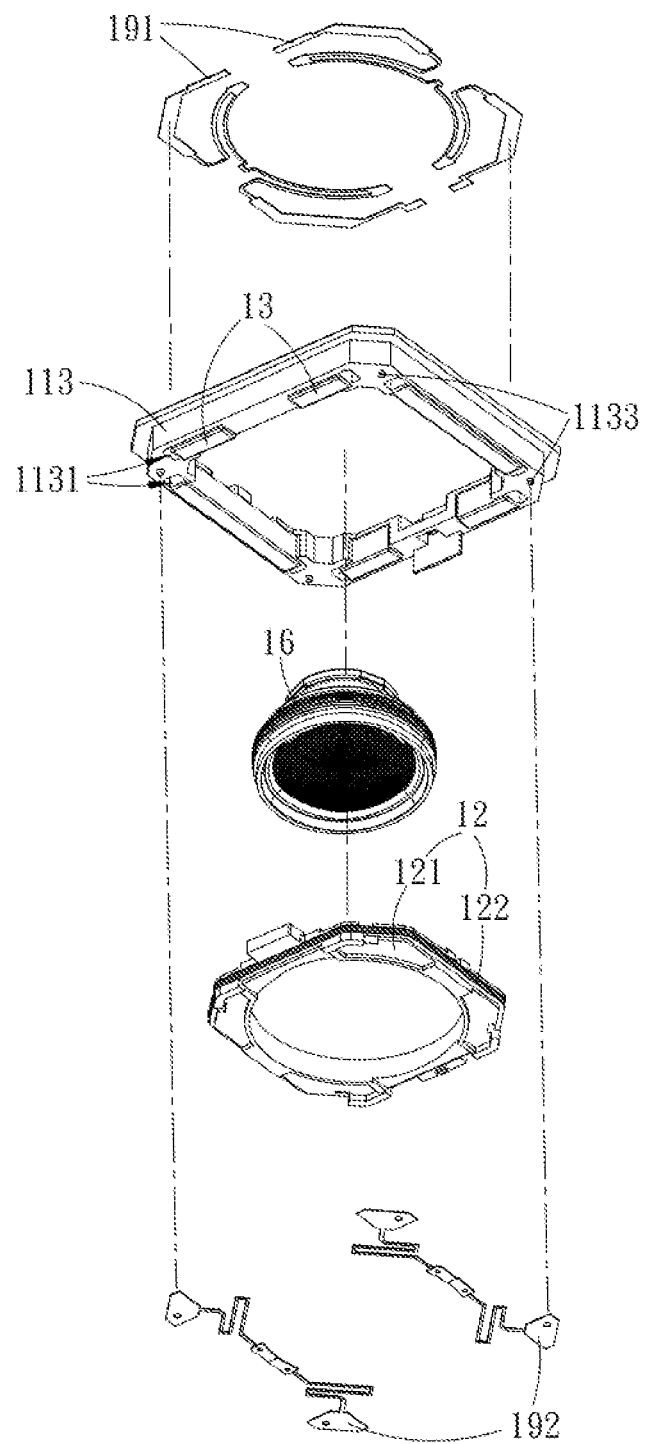
FIG. 17 is another exploded view of internal components of the camera assembly of the present disclosure.

Referring to FIG. 3 and FIG. 4 again, in some embodiments, the first end parts 181 of the two flexible circuit boards 18 are parallel to the surface of the baseplate 142. The body part 183 is vertical to the surface of the baseplate 142, and the second end part 182 is vertical to the surface of the baseplate 142. In some embodiments, the body parts 183 of the two flexible circuit boards 18 are disposed on the X-Y plane between the housing 111 and the light sensing component 14, and the second end parts 182 of the two flexible circuit boards 18 are exposed from the housing 111. In some embodiments, the housing 111 comprises two notches 1110 from which the second end parts 182 of the two flexible circuit boards 18 are exposed. In some embodiments, the base 112 comprises two securing sidewalls 1123, which extend vertically upward from sides of the base 112 and correspond to the two notches 1110. The second end parts 182 of the two flexible circuit boards 18 are disposed on the two securing sidewalk 1123 and are exposed from the two notches 1110, FIG. 16 and FIG. 17 are exploded views of internal components of the camera assembly of the present disclosure. As shown in the figures, in this embodiment, the casing 11 further comprises a holder 113 disposed inside the housing 111 and comprises a plurality of recesses 1131. The magnetic component 13 is disposed in the plurality of recesses 1131 of the holder 113, which surrounds the carrying component 12. The camera assembly 1 further comprises a first spring member 191 and a second spring member 192. An upper surface of the holder 113 comprises an accommodating recess 1132, and four sides of a lower surface of the holder comprise a securing column. The first spring member 191 is disposed in the accommodating recess 1132 of the holder 113, and the first spring member 191 is disposed between the holder 113 and the housing 111. The second spring member 192 is disposed at the securing column 1133 of the holder 113, and the second spring member 192 is disposed at the periphery of the light sensing member 141. Wherein, an inner side of the first spring member 191 abuts against the top of the lens component 16, and an inner side of the second spring member 192 supports the periphery of the bottom of the lens component 16. When the lens component 16 is driven by the carrying body 121, the first spring member 191 and the second spring member 192 could keep the balance during the movement of the lens component 16. Meanwhile, the first spring member 191 and the second spring member 192 could be used as circuits for providing electric power or signal transmission. Besides, the flexible circuit board 18 disposed around the light sensing component 14 is disposed in the gap between the housing 111 and the holder 113 to limit the circuit path of the flexible circuit board 18.

In summary, embodiments of the present disclosure provide a camera assembly having a driving mechanism for focusing with a driving mechanism for optical image stabilization to allow the first coil of the carrying component and the second coil of the light sensing component to jointly correspond to the magnetic field of the magnetic component, Thus, the space occupied in the housing can be reduced, and the cost can also be reduced.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A camera assembly, comprising:
a casing comprising a lens accommodating groove, a housing, and a base, the housing being disposed on the base, the lens accommodating groove being disposed between the housing and the base, an opening of the lens accommodating groove being disposed at the housing;
a light sensing component comprising a light sensing member and a baseplate, the light sensing member being disposed on the baseplate, the light sensing member being correspondingly disposed at a bottom of the lens accommodating groove, the light sensing component being disposed on the base; and
a flexible circuit board comprising a first end part, a second end part, and a body part disposed between the first end part and the second end part, the first end part being connected to a side of the baseplate, the body part surrounding a periphery of the light sensing component, the second end part being disposed at a side of the light sensing component.

2. The camera assembly according to claim 1, wherein the first end part of the flexible circuit board is parallel to a surface of the baseplate; the body part and the second end part of the flexible circuit board are vertical to the surface of the baseplate.

3. The camera assembly according to claim 2, further comprising a carrying component and a magnetic component, the carrying component comprising a carrying body and a first coil disposed at the periphery of the carrying body, the carrying component being assembled in the lens accommodating groove, the magnetic component being disposed at the periphery of the first coil, the magnetic component being disposed on an inner wall of the lens accommodating groove.

4. The camera assembly according to claim 2, further comprising a carrying board carrying a bottom of the light sensing component, the carrying hoard being slidably disposed on the base.

5. The camera assembly according to claim 1, wherein the number of the flexible circuit boards is two; the first end parts of the two flexible circuit boards are connected to two opposite sides of the baseplate; the body parts of the two flexible circuit boards extend vertically upward relative to a surface of the baseplate, and the body parts of the two flexible circuit boards extend along the periphery of the light sensing component in opposite directions and are connected to the second end parts.

6. The camera assembly according to claim 5, wherein the first end part of the flexible circuit board is parallel to the surface of the baseplate; the body part and the second end part of the flexible circuit board are vertical to the surface of the baseplate.

7. The camera assembly according to claim 1, wherein the number of the flexible circuit boards is two; the first end parts of the two flexible circuit boards are connected to a same side of the baseplate; the body parts of the two flexible circuit boards extend vertically upward relative to a surface of the baseplate, and the body parts of the two flexible circuit boards extend along the periphery of the light sensing component in opposite directions and are connected to the second end parts.

8. The camera assembly according to claim 7, wherein the first end part of the flexible circuit board is parallel to the surface of the baseplate; the body part and the second end part of the flexible circuit board are vertical to the surface of the baseplate.

9. The camera assembly according to claim 1, further comprising a carrying component and a magnetic component, the carrying component comprising a carrying body and a first coil disposed at the periphery of the carrying body, the carrying component being assembled in the lens accommodating groove, the magnetic component being disposed at the periphery of the first coil, the magnetic component being disposed on an inner wall of the lens accommodating groove.

10. The camera assembly according to claim 9, wherein the light sensing component comprises a second coil; the second coil is disposed at the periphery of the light sensing member; the second coil is disposed below the magnetic component.

11. The camera assembly according to claim 10, wherein the number of the second coils is multiple; the plurality of second coils comprise a first direction coil group and a second direction coil group; the first direction coil group is disposed on two opposite sides of the light sensing member; the second direction coil group is disposed on another two opposite sides of the light sensing member.

12. The camera assembly according to claim 11, wherein the first direction coil group comprises a plurality of first side coils and a plurality of second side coils; the plurality of first side coils are disposed on a side of the light sensing member; the plurality of second side coils are disposed on another side of the light sensing member opposite to the side where the plurality of first side coils are disposed.

13. The camera assembly according to claim 9, further comprising a lens component assembled to the carrying body, the lens component being disposed in the lens accommodating groove.

14. The camera assembly according to claim 1, further comprising a carrying board carrying a bottom of the light sensing component, the carrying board being slidably disposed on the base.

15. The camera assembly according to claim 14, wherein the base comprises a plurality of recesses and a plurality of balls slidably disposed in the plurality of recesses; a bottom surface of the carrying board is in contact with the plurality of balls.

16. The camera assembly according to claim 15, wherein the bottom surface of the carrying board further comprises a plurality of bumps extended into the plurality of recesses; a thickness of each of the bumps is smaller than a depth of each of the recesses; an outer diameter of each of the bumps is smaller than a diameter of the opening of each of the recesses: the plurality of balls are respectively disposed between the corresponding recess and the corresponding bump.

17. The camera assembly according to claim 10, further comprising a plurality of first magnetic members and a plurality of second magnetic members, the plurality of first magnetic members being disposed on the base, the plurality of second magnetic members being disposed on the carrying board corresponding to the positions of the plurality of first magnetic members, the plurality of first magnetic members and the plurality of second magnetic members being mutually attracted.

18. The camera assembly according to claim 9, wherein the casing further comprises a holder disposed on the inside of the housing; the magnetic component is disposed at the holder surrounding the carrying component.

19. The camera assembly according to claim 18, further comprising a first spring member and a second spring member, an upper surface of the holder comprising an accommodating recess, a circumference of a lower surface of the holder comprising a securing column, the first spring member being disposed in the accommodating recess of the holder; an inner side of the first spring member abutting against a top of the carrying body, the first spring member being disposed between the holder and the housing, the second spring member being disposed at the securing column of the holder, an inner side of the second spring member supporting a bottom of the carrying body, the second spring member being disposed at the periphery of the light sensing member.

* * * * *